(12) United States Patent
Saito et al.

(10) Patent No.: US 11,532,461 B2
(45) Date of Patent: Dec. 20, 2022

(54) SUBSTRATE PROCESSING APPARATUS

(71) Applicant: Tokyo Electron Limited, Tokyo (JP)

(72) Inventors: Michishige Saito, Miyagi (JP); Shota Kaneko, Miyagi (JP); Shuhei Yamabe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 292 days.

(21) Appl. No.: 16/659,744

(22) Filed: Oct. 22, 2019

(65) Prior Publication Data
US 2020/0126816 A1 Apr. 23, 2020

(30) Foreign Application Priority Data

Oct. 23, 2018 (JP) .............................. JP2018-199512
Aug. 9, 2019 (JP) .............................. JP2019-148135

(51) Int. Cl.
*H01J 37/32* (2006.01)
*C23C 16/44* (2006.01)
*C23C 16/54* (2006.01)

(52) U.S. Cl.
CPC .... *H01J 37/32495* (2013.01); *C23C 16/4411* (2013.01); *H01J 37/32513* (2013.01); *H01J 37/32743* (2013.01); *C23C 16/54* (2013.01)

(58) Field of Classification Search
CPC .......... H01J 37/32495; H01J 37/32743; H01J 37/32513; C23C 16/4411; C23C 16/54; H01L 21/673; H01L 21/67109; H01L 21/6719; H01L 21/67126; H01L 21/68757
See application file for complete search history.

(56) References Cited

U.S. PATENT DOCUMENTS

| | | | | |
|---|---|---|---|---|
| 5,143,552 A * | 9/1992 | Moriyama | ........... | H01L 21/6715 118/319 |
| 5,520,742 A * | 5/1996 | Ohkase | .................... | C23C 16/54 118/724 |
| 5,554,266 A * | 9/1996 | Okamoto | ................. | C23C 14/50 156/345.51 |
| 5,571,010 A * | 11/1996 | Okase | .................. | C23C 16/4583 432/239 |
| 5,704,214 A * | 1/1998 | Fujikawa | ............. | C23C 16/4412 62/55.5 |
| 6,332,724 B1 * | 12/2001 | Yano | .................. | H01L 21/67248 396/611 |
| 9,017,481 B1 * | 4/2015 | Pettinger | ........... | H01J 37/32449 118/724 |
| 10,804,120 B2 * | 10/2020 | Ha | ..................... | H01J 37/32458 |
| 2002/0114632 A1 * | 8/2002 | Deguchi | ........... | H01L 21/67109 396/611 |
| 2003/0159307 A1 * | 8/2003 | Sago | ................. | H01L 21/67017 34/107 |

(Continued)

FOREIGN PATENT DOCUMENTS

JP    2015-126197 A    7/2015

*Primary Examiner* — Jeffrie R Lund
(74) *Attorney, Agent, or Firm* — Pearne & Gordon LLP (57) ABSTRACT

A substrate processing apparatus includes a processing vessel; a placing table provided within the processing vessel and configured to place a substrate thereon; and a component disposed between the processing vessel and the placing table, the component constituting an anode. The component has a flow path through which a heat exchange medium flows.

17 Claims, 7 Drawing Sheets

(56) References Cited

U.S. PATENT DOCUMENTS

| | | | |
|---|---|---|---|
| 2003/0228772 A1* | 12/2003 | Cowans | H01J 37/32724 438/795 |
| 2004/0244690 A1* | 12/2004 | Cho | C23C 16/458 118/723 I |
| 2009/0169769 A1* | 7/2009 | Nishimura | H01L 21/67109 427/569 |
| 2010/0282168 A1* | 11/2010 | Kishimoto | H01L 21/67109 118/723 R |
| 2012/0222818 A1* | 9/2012 | Sakata | H01L 21/67109 156/345.53 |
| 2013/0093446 A1* | 4/2013 | Mochizuki | G01R 1/0491 324/750.08 |
| 2014/0319672 A1* | 10/2014 | Tsubokawa | H01J 37/32715 257/712 |
| 2015/0179485 A1* | 6/2015 | Hiroki | H01L 21/6831 165/61 |
| 2016/0340780 A1* | 11/2016 | Swan | C23C 16/4411 |
| 2016/0378092 A1* | 12/2016 | Yamamoto | G05B 19/404 700/300 |
| 2018/0174869 A1* | 6/2018 | Ha | H01L 21/67248 |
| 2019/0348262 A1* | 11/2019 | Hayasaka | H01J 37/32522 |
| 2020/0126816 A1* | 4/2020 | Saito | H01J 37/32743 |
| 2020/0161105 A1* | 5/2020 | Mo | H01L 21/6831 |
| 2020/0176230 A1* | 6/2020 | Lu | C23C 16/4586 |
| 2020/0243355 A1* | 7/2020 | Makabe | H01L 21/67109 |
| 2020/0251315 A1* | 8/2020 | Saito | H01L 21/67103 |
| 2020/0373130 A1* | 11/2020 | Tanikawa | H01J 37/32532 |
| 2020/0402775 A1* | 12/2020 | Hayasaka | H01J 37/32743 |
| 2021/0217639 A1* | 7/2021 | Ha | B65G 47/90 |
| 2021/0272779 A1* | 9/2021 | Hayasaka | H01J 37/32522 |
| 2021/0272834 A1* | 9/2021 | Takayama | B32B 37/12 |

* cited by examiner

H-H CROSS SECTION

FIG. 7B

H-H CROSS SECTION

SUBSTRATE PROCESSING APPARATUS

CROSS-REFERENCE TO RELATED APPLICATION

This application claims the benefit of Japanese Patent Application Nos. 2018-199512 and 2019-148135 filed on Oct. 23, 2018 and Aug. 9, 2019, respectively, the entire disclosures of which are incorporated herein by reference.

TECHNICAL FIELD

The various aspects and embodiments described herein pertain generally to a substrate processing apparatus.

BACKGROUND

There is known a substrate processing apparatus configured to perform a preset processing on a substrate such as a wafer.

Patent Document 1 describes a substrate processing apparatus equipped with a cylindrical chamber having an opening, a deposition shield disposed along an inner wall of the chamber and having an opening at a position corresponding to the opening of the chamber, and a shutter configured to open or close the opening of the deposition shield.

Patent Document 1: Japanese Patent Laid-open Publication No. 2015-126197.

SUMMARY

In one exemplary embodiment, a substrate processing apparatus includes a processing vessel; a placing table provided within the processing vessel and configured to place a substrate thereon; and a component disposed between the processing vessel and the placing table, the component constituting an anode. The component has a flow path through which a heat exchange medium flows.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the various drawings, same parts will be assigned same reference numerals, and redundant description will be omitted.

[Plasma Processing Apparatus]

Figure 1:
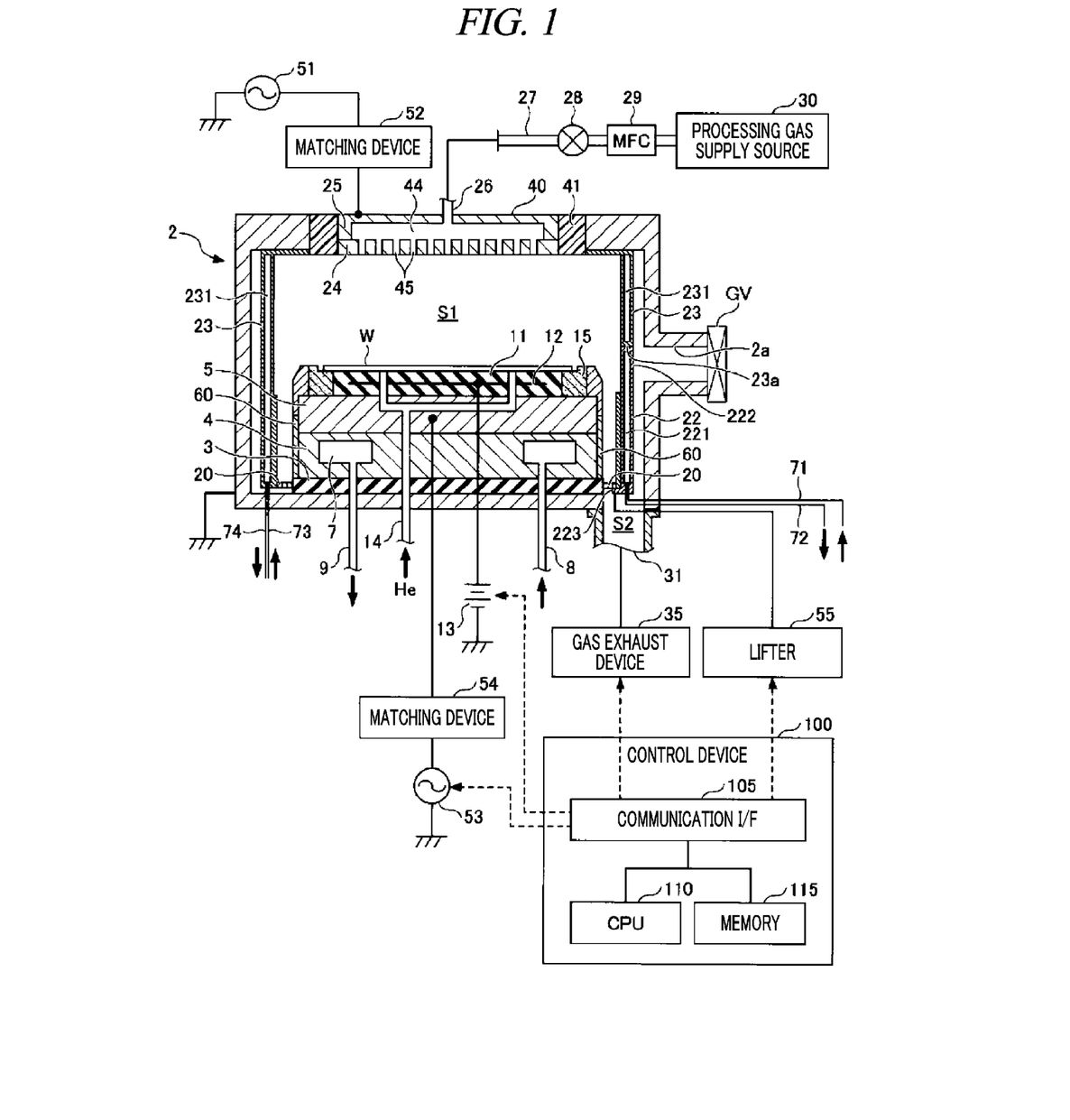
FIG. 1 is a schematic cross sectional view illustrating an example of a plasma processing apparatus according to an exemplary embodiment.

First, a plasma processing apparatus (substrate processing apparatus) according to an exemplary embodiment will be explained with reference to FIG. 1. FIG. 1 is a schematic cross sectional view illustrating an example of the plasma processing apparatus according to the exemplary embodiment.

The plasma processing apparatus is configured to perform a preset processing (for example, an etching processing, a film forming processing, a cleaning processing, an aching processing, or the like) on a substrate such as a wafer W.

The plasma processing apparatus has a substantially cylindrical processing vessel 2 made of, for example, aluminum having an anodically oxidized surface. The processing vessel 2 is grounded.

A substantially columnar supporting table 4 is provided at a bottom of the processing vessel 2 with an insulating plate 3 such as ceramics therebetween. A stage 5, serving as a lower electrode, configured to hold the wafer W is provided on the supporting table 4. The stage 5 may also be referred to as a mounting table.

A cooling room 7 is provided within the supporting table 4. A coolant is introduced into the cooling room 7 via a coolant inlet line 8. The coolant is circulated in the cooling room 7 and discharged from a coolant outlet line 9. A gas passageway 14 is formed through the insulating plate 3, the supporting table 4, the stage 5 and an electrostatic chuck 11 to supply a heat exchange medium (for example, a He gas or the like) to a rear surface of the wafer W. A cold heat of the stage 5 is delivered to the wafer W through the heat exchange medium, so that the wafer W is maintained at a preset temperature.

The electrostatic chuck 11 having a circular shape and having a diameter substantially equal to a diameter of the wafer W is provided on a central portion of a top surface of the stage 5. The electrostatic chuck 11 includes an insulator and an attraction electrode 12 embedded in the insulator. The attraction electrode 12 is connected to a DC power supply 13. As a DC voltage is applied to the electrostatic chuck 11 from the DC power supply 13, the wafer W is electrostatically attracted to the electrostatic chuck 11 by a Coulomb force.

A circular ring-shaped edge ring (also called a focus ring) 15 is disposed at a peripheral portion of the top surface of the stage 5 to surround the wafer W placed on the electrostatic chuck 11. The edge ring 15 is made of a conductive material such as, but not limited to, silicon, and is configured to improve plasma uniformity. A side surface of the stage 5 is covered with a side covering member 60.

Disposed above the stage 5 is a gas shower head 40. The gas shower head 40 is disposed to face the stage 5 which serves as the lower electrode, and serves as an upper electrode. The gas shower head 40 is supported at a ceiling of the processing vessel 2 with an insulator 41 therebetween. The gas shower head 40 includes an electrode plate 24 and an electrode supporting body 25 configured to support the electrode plate 24. The electrode supporting body 25 is made of a conductive material. The electrode plate 24 is made of a semiconductor or a conductor such as SiC or silicon and has a multiple number of gas holes 45. The electrode plate 24 forms a facing surface which faces the stage 5.

A gas inlet opening 26 is provided at a center of the electrode supporting body 25, and a gas supply line 27 is connected to the gas inlet opening 26. The gas supply line 27 is connected with a processing gas supply source 30 via an opening/closing valve 28 and a mass flow controller (MFC) 29. The processing gas supply source 30 is configured to supply a processing gas for the plasma processing such as etching, a cleaning gas for the cleaning processing, or the like. A flow rate of the gas is controlled by the mass flow controller (MFC) 29, and the gas is introduced into a gas diffusion space 44 via the gas supply line 27 and the gas inlet opening 26 as the opening/closing valve 28 is opened. The gas is diffused in the gas diffusion space 44 and introduced into the processing vessel 2 through the multiple number of gas holes 45.

A deposition shield 23 is detachably provided at the processing vessel 2 to suppress a reaction product generated in the plasma processing such as etching from adhering to an inner wall of the processing vessel 2. The deposition shield 23 is grounded. Further, the deposition shield 23 may be provided in an exhaust space S2 near side edge surfaces of the supporting table 4 and the stage 5.

An annular baffle plate 20 is provided between the deposition shield 23 and the stage 5. Each of the deposition shield 23 and the baffle plate 20 may be made of an aluminum member coated with ceramics such as alumina or yttria ($Y_2O_3$).

The baffle plate 20 is configured to rectify a flow of the gas to allow the gas to be uniformly exhausted from a plasma processing space S1 into the exhaust space S2. The plasma processing space S1 is a plasma formation space (plasma processing space) formed by the stage 5, the gas shower head 40, the deposition shield 23 and the baffle plate 20. Within the plasma processing space S1, a preset plasma is formed from the gas supplied from the gas shower head 40, and the preset processing is performed on the wafer W by the plasma.

A part of the plasma processing space S1 is configured to be opened or closed by a shutter 22. That is, the processing vessel 2 is provided with an opening 2a through which the wafer W is carried into or out of the plasma processing space S1. A gate valve GV configured to open or close the opening 2a is provided at a sidewall of the processing vessel 2. Further, the deposition shield 23 is provided with an opening 23a at a position corresponding to the opening 2a. The shutter 22 opens or closes the opening 23a by being moved up and down with a lifter 55. The shutter 22 is grounded. When the wafer W is carried in or out, the gate valve GV is opened, and the shutter 22 is opened by being moved down with the lifter 55. Then, the wafer W is carried into the plasma processing space S1 or carried out of the plasma processing space S1 through the opening 23a of the deposition shield 23.

A flow path 221 (see FIG. 3 to be described later) through which a coolant (heat exchange medium) flows is provide within the shutter 22. The coolant is introduced into the flow path 221 via an inlet line 71. The coolant is circulated within the flow path 221 and discharged from an outlet line 72. Further, a flow path 231 through which the coolant flows is provided within the deposition shield 23. The coolant is introduced into the flow path 231 via an inlet line 73. The coolant is circulated within the flow path 231 and discharged from an outlet line 74. Further, a flowmeter configured to detect a flow rate of the coolant, a regulator configured to adjust the flow rate of the coolant may be additionally provided. A control device 100 to be described later controls the flow rate of the coolant to be supplied to the flow path 221 based on an amount of heat applied to the shutter 22 from the plasma in the plasma processing space S1. Accordingly, a temperature of the shutter 22 can be set to be in a required temperature range. Likewise, the control device 100 controls the flow rate of the coolant to be supplied to the flow path 231 based on an amount of heat applied to the deposition shield 23 from the plasma in the plasma processing space S1. Accordingly, a temperature of the deposition shield 23 can be set to be in a required temperature range. The kind of the coolant is not particularly limited. By way of example, the coolant may be a gas such as dry air, or a liquid such as cooling water.

The exhaust space S2 for the exhaust of the gas is formed under the baffle plate 20 below the plasma processing space S1. Accordingly, the plasma is suppressed from reaching the exhaust space S2 at a downstream of the baffle plate 20.

A first high frequency power supply 51 is configured to generate a high frequency power HF for plasma formation. The first high frequency power supply 51 generates the high frequency power HF having a frequency of, e.g., 60 MHz. The first high frequency power supply 51 is connected to the gas shower head 40 via a matching device 52. The matching device 52 is a circuit configured to match an output impedance of the first high frequency power supply 51 and an input impedance at a load side (upper electrode side).

A second high frequency power supply 53 is configured to generate a high frequency bias power LF for ion attraction into the wafer W. The second high frequency power supply 53 generates the high frequency bias power LF having a frequency of, e.g., 20 MHz. The second high frequency power supply 53 is connected to the stage 5 via a matching device 54. The matching device 54 is a circuit configured to match an output impedance of the second high frequency power supply 53 and an input impedance at a load side (lower electrode side).

An exhaust line 31 is connected to the bottom of the processing vessel 2, and the exhaust line 31 is connected to an exhaust device 35. The exhaust device 35 has a vacuum pump such as a turbo molecular pump, and is capable of evacuating the processing vessel 2 up to a preset decompressed atmosphere. Further, a gate valve GV is provided at the sidewall of the processing vessel 2, and the wafer W is carried into or out of the processing vessel 2 as the gate valve GV is opened.

The plasma processing apparatus is controlled by the control device 100. The control device 100 is a computer equipped with a communication interface (I/F) 105, a CPU 110, a memory 115, and so forth. The memory 115 stores therein control programs for controlling various kinds of plasma processings such as etching performed in the plasma processing apparatus by the CPU 110, and programs for controlling the components of the plasma processing apparatus to perform a processing under processing conditions, that is, a recipe. The CPU 110 controls the individual components (the lifter 55, the exhaust device 35, the DC power supply 13, the first high frequency power supply 51, the second high frequency power supply 53, the processing gas supply source 30, and so forth) of the plasma processing apparatus by using the recipe or the control programs stored in the memory 115.

Now, the shutter 22 having the flow path 221 and the deposition shield 23 having the flow path 231 will be further described with reference to FIG. 2 and FIG. 3. In the following description, the shutter 22 having the flow path 221 will be explained as an example. Since a structure of the flow path 231 of the deposition shield 23 is the same as a structure of the flow path 221 of the shutter 22, redundant description will be omitted.

Figure 2:
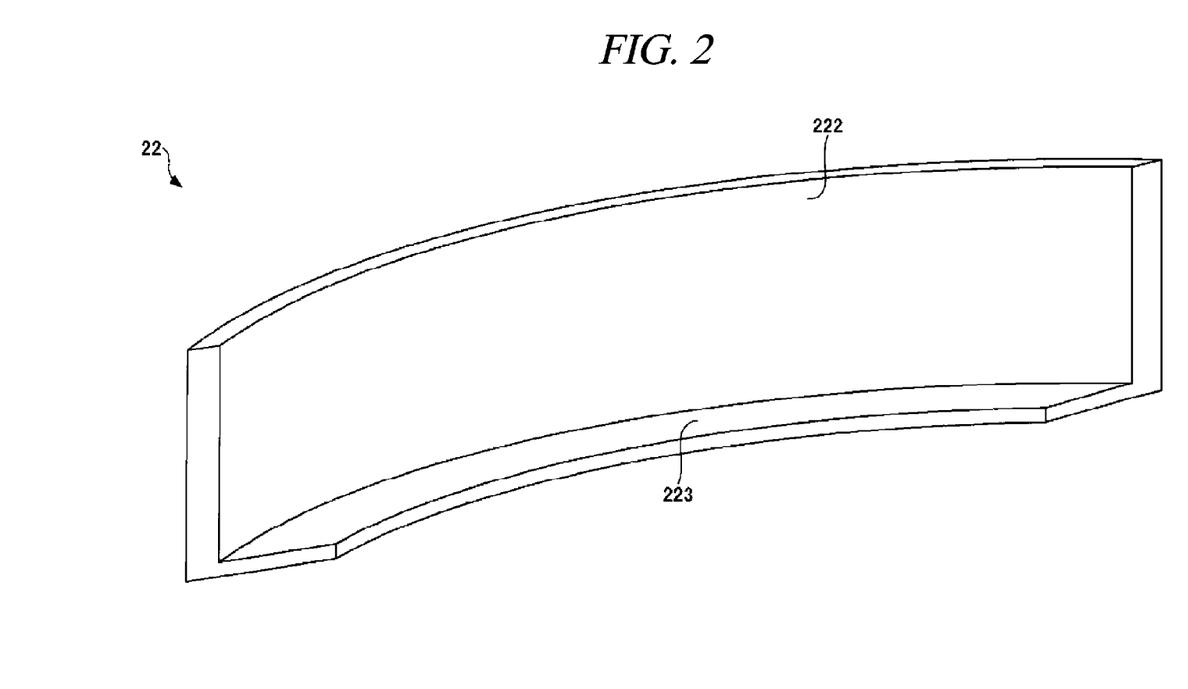
FIG. 2 is a perspective view illustrating an example of a shutter of the plasma processing apparatus according to the exemplary embodiment.

FIG. 2 is a perspective view illustrating an example of the shutter 22 of the plasma processing apparatus according to the exemplary embodiment. FIG. 3 is a partially cross sectional perspective view illustrating an example of an internal structure of the shutter 22 of the plasma processing apparatus according to the exemplary embodiment. Further, FIG. 3 illustrates a cross section cut along a sidewall portion 222 facing the plasma processing space S1.

As depicted in FIG. 2, the shutter 22 has the sidewall portion 222 and a rib 223. The sidewall portion 222 is a member configured to close the opening 23a of the deposition shield 23 and is curved in an arc shape to conform to the cylindrical deposition shield 23. The rib 223 extends from a lower end of the sidewall portion 222 toward a center of the processing vessel 2. A bottom surface of the rib 223 is supported by the lifter 55. When the shutter 22 closes the opening 23a, a top surface of the rib 223 may come into contact with the deposition shield 23. Further, an upper end of the sidewall portion 222 may come into contact with the deposition shield 23. With this configuration, the deposition shield 23 and the shutter 22 are electrically connected, so that the shutter 22 is grounded.

Figure 3:
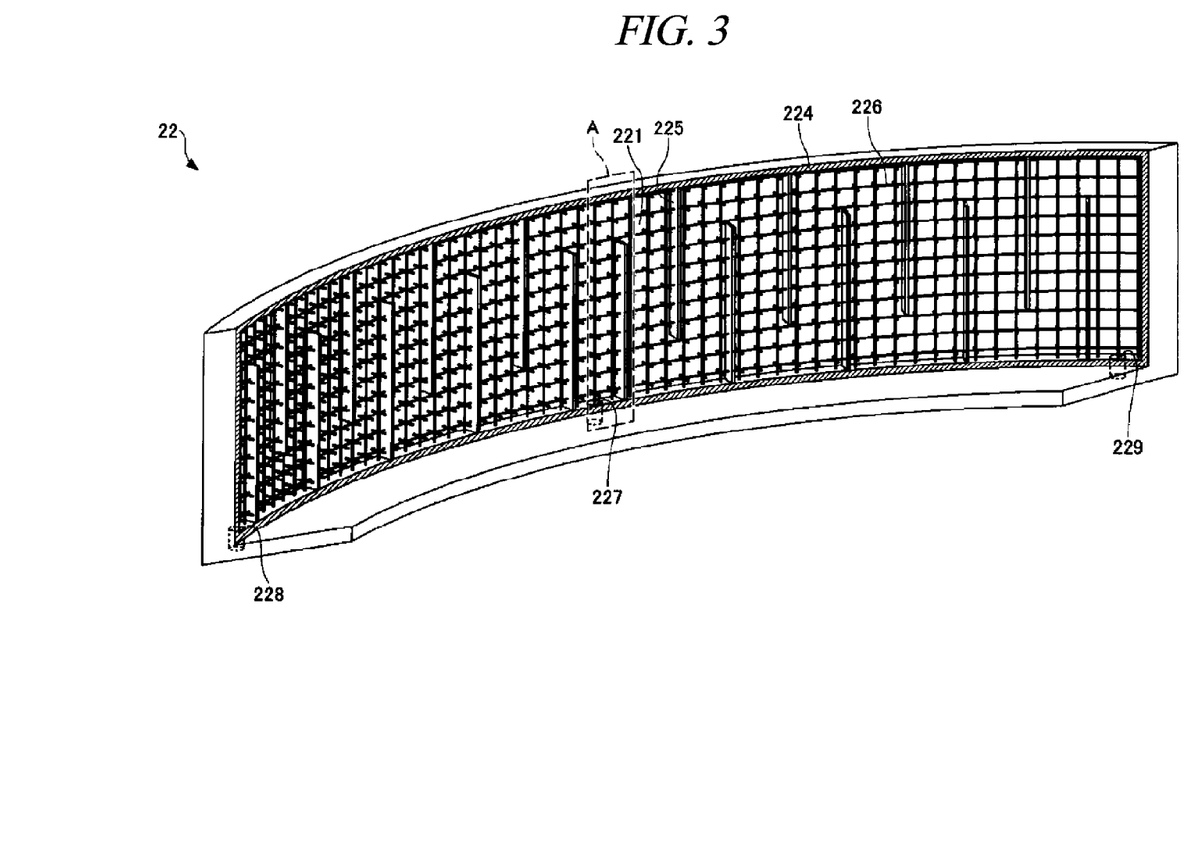
FIG. 3 is a partially cross sectional perspective view illustrating an example of an internal structure of the shutter of the plasma processing apparatus according to the exemplary embodiment.

As depicted in FIG. 3, the flow path 221 through which the coolant flows is formed within the sidewall portion 222 of the shutter 22. That is, the shutter 22 includes a frame member 224 which has an internal space therein and forms an outline of the shutter 22; a partition member 225 which is disposed within the frame member 224 and forms the flow path 221; and heat exchange accelerating members 226 which are disposed in the flow path 221.

The frame member 224 is provided with an inlet path 227 and outlet paths 228 and 229 through which the internal space and the outside of the frame member 224 communicate with each other. Further, in the example shown in FIG. 3, the inlet path 227 is formed at a lower central portion of the frame member 224 in a circumferential direction, and the outlet paths 228 and 229 are formed at lower end portions of the frame member 224 in the circumferential direction.

The partition member 225 is disposed within the frame member 224 and forms the flow path 221 extending from the inlet path 227 to the outlet paths 228 and 229. Further, in the example shown in FIG. 3, one end of the flow path 221 communicates with the inlet path 227 and is branched at a portion of the flow path 221 to extend outwards in the circumferential direction while going up and down. Further, the other ends of the branched flow path 221 are illustrated to respectively communicate with the outlet paths 228 and 229, but not limited thereto.

The heat exchange accelerating members 226 are disposed within the flow path 221 formed by the partition member 225 and the frame member 224. That is, the heat exchange accelerating members 226 are disposed to impede the flow of the coolant flowing in the flow path 221. The heat exchange accelerating members 226 accelerate a heat exchange between the shutter 22 and the coolant by increasing an area of contact with the coolant flowing in the flow path 221. Further, the heat exchange accelerating members 226 support the frame member 224 from inside. With this structure, strength and rigidity of the shutter 22 having a hollow structure can be obtained. By way of example, the heat exchange accelerating members 226 may have a mesh-shaped or column-shaped structure, or may have a lattice structure. Further, the shape and the arrangement of the heat exchange accelerating members 226 are not limited to the mentioned examples.

Though not shown, the rib 223 may have a light-weighted structure capable of obtaining the strength and the rigidity, such as a mesh-shaped or column-shaped structure, a lattice structure or a honeycomb structure.

Figure 4A:
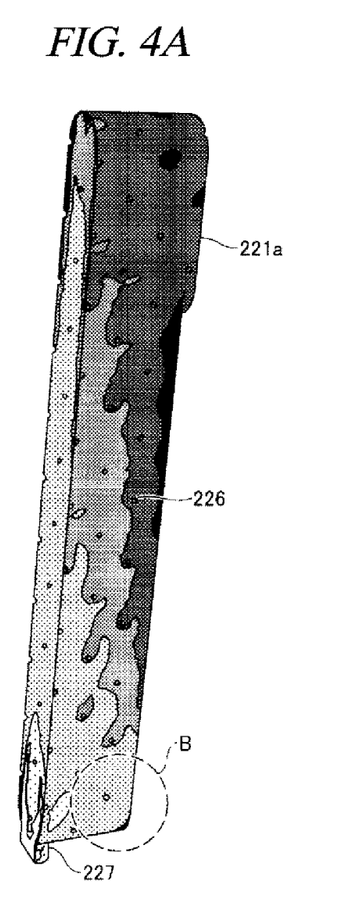
FIG. 4A and FIG. 4B are perspective views illustrating an example of a simulation result of a temperature distribution.
Figure 4B:
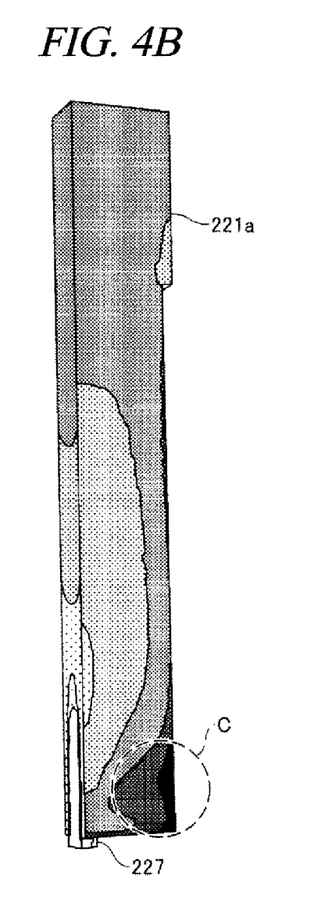
Figure 5A:
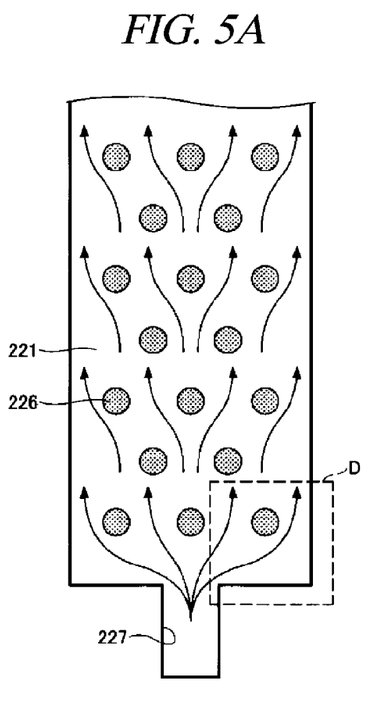
FIG. 5A and FIG. 5B are schematic diagrams illustrating a flow of a coolant within a flow path.
Figure 5B:
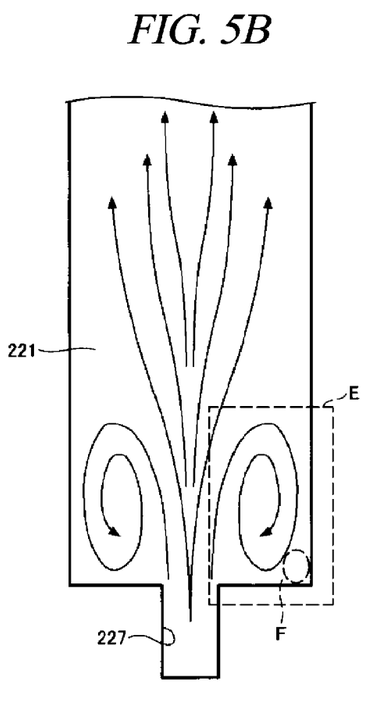

FIG. 4A and FIG. 4B are perspective views showing an example of a simulation result of a temperature distribution of the coolant within the flow path 221. FIG. 5A and FIG. 5B are schematic diagrams illustrating a flow of the coolant within the path 221. Further, FIG. 4A and FIG. 5A illustrate a case where the heat exchange accelerating members 226 are provided within the flow path 221, whereas FIG. 4B and FIG. 5B illustrate a case where the heat exchange accelerating members 226 are not provided. Further, in simulation results of FIG. 4A and FIG. 4B, a higher temperature is hatched darker. Furthermore, the flow of the coolant is indicated by arrows in FIG. 5A and FIG. 5B.

A simulation of a temperature distribution of the coolant is conducted for a case where a heat input amount to the shutter 22 from the plasma processing space S1 is set to be 1 W/m$^2$ and dry air as the coolant is flown from the inlet path 227 to the outlet paths 228 and 229. Further, as shown in FIG. 3, since the flow path 221 has a bilaterally symmetrical shape, the simulation is conducted only for one side. FIG. 4A and FIG. 4B show simulation results in a region indicated by a dashed line A in FIG. 3.

As depicted in FIG. 4B, it is found out that a temperature of the coolant at an outlet surface 221a is increased higher than a temperature of the coolant at an inlet surface as a result of allowing the coolant to flow through the flow path 221. To elaborate, the temperature of the coolant at the outlet surface 221a is increased by 0.2° C. at maximum from the temperature of the coolant at the inlet surface. That is, it is found out that the shutter 22 can be cooled.

Furthermore, as shown in FIG. 4A, it is found out that the temperature of the coolant at the outlet surface 221a can be increased higher than the example of FIG. 4B by disposing the heat exchange accelerating members 226 within the flow path 221. To elaborate, the temperature of the coolant at the outlet surface 221a is increased by 0.43° C. at maximum from the temperature of the coolant at the inlet surface. That is, it is found out that efficiency of the heat exchange between the shutter 22 and the coolant is improved by disposing the heat exchange accelerating members 226 within the flow path 221.

Moreover, a region where the temperature of the coolant is increased is formed at a corner region indicated by a dashed line C in FIG. 4B. As illustrated in FIG. 5B, when the coolant flows into the flow path 221 form the inlet path 227, the coolant mainly flows along a center of the flow path 221, and a vortex is generated at a region indicated by a dashed line E. The coolant is stagnant in a region indicated by a dashed line F between a flow of the vortex and the corner region of the flow path 221. Through the heat exchange with the shutter 22, the temperature of the coolant at this corner region is increased. Further, because of the stagnation, it is difficult for the coolant to flow toward the outlet surface 221a. As a result, as depicted in FIG. 4B, the region where the temperature of the coolant is increased is formed at the corner region indicated by the dashed line C.

Meanwhile, by disposing the heat exchange accelerating members 226 within the flow path 221, a rectifying effect is achieved, as depicted in FIG. 5A. That is, as shown in FIG. 5A, the heat exchange accelerating members 226 are disposed to impede the flow of the coolant. Accordingly, the flow of the coolant within the flow path 221 is distributed by the heat exchange accelerating members 226. The distributed coolant is supplied up to a corner region indicated by a dashed line D. The coolant supplied to the corner region flows toward the outlet surface 221a. Thus, as shown in FIG. 4A, there is found no region where the temperature of the coolant is increased at the corner region indicated by a dashed line B.

The plasma processing apparatus according to the exemplary embodiment as described above is equipped with the shutter 22 having the flow path 221 and the deposition shield 23 having the flow path 231, and the coolant flows through the flow paths 221 and 231.

Meanwhile, as a device structure of the wafer W is miniaturized and highly integrated, an aspect ratio of a contact hole or the like is increased. For the reason, in an etching with a high aspect ratio, the high frequency bias power LF tends to have a low frequency and a high power. As a result, a potential difference between the plasma and the shutter 22 and the deposition shield 23 having the ground potential is increased. Increase and acceleration of consumption of a component by ion sputtering and temperature rise of the component due to the increase of the heat input amount from the plasma (that is, deterioration of temperature controllability) become issues that are sought to be solved.

In contrast, in the shutter 22 and the deposition shield 23 of the plasma processing apparatus according to the exemplary embodiment, the temperature can be controlled by allowing the coolant to flow through the flow paths 221 and 231. Accordingly, even if the heat input amount to the shutter 22 and the deposition shield 23 is increased due to the high power of the high frequency bias power LF, for example, the shutter 22 and the deposition shield 23 can be cooled to have a preset temperature range.

Furthermore, since the shutter 22 and the deposition shield 23 have the hollow structure, the shutter 22 and the deposition shield 23 can be light-weighted as compared with a shutter and a deposition shield which are solid (filled up). By light-weighting the shutter 22 and the deposition shield 23, heat capacity is decreased. As a result, thermal responsiveness can be improved when controlling the temperatures of the shutter 22 and the deposition shield 23 by allowing the coolant to flow through the flow paths 221 and 231. Therefore, the shutter 22 and the deposition shield 23 can have a target temperature range rapidly, so that productivity of a substrate processing by the plasma processing apparatus is improved.

Further, when performing maintenance of the plasma processing apparatus, the deposition shield 23, for example, is taken out of the processing vessel 2. By light-weighting the deposition shield 23, workability can be improved. Furthermore, by light-weighting the shutter 22 as a moving member, an output of the lifter 55 can be reduced. In addition, a cost for the materials of the shutter 22 and the deposition shield 23 can be lowered.

Further, by providing the heat exchange accelerating members 226 within the flow paths 221 and 231, a contact area with the coolant flowing in the flow paths 221 and 231 is increased. Therefore, the heat exchange efficiency is improved. Further, since the flow of the coolant which diverges and joins again is formed at a downstream of the heat exchange accelerating members 226 which are disposed within the flow path 221 as obstacles, the heat exchange efficiency is improved. Accordingly, by allowing the coolant to flow within the flow paths 221 and 231, the thermal responsiveness can be improved when controlling the temperatures of the shutter 22 and the deposition shield 23. Besides, by providing the heat exchange accelerating members 226 within the flow path 221 (231), the stagnation of the coolant at the corner region of the flow path 221 (231) is suppressed, as can be seen from the comparison of FIG. 5A and FIG. 5B. Accordingly, the uniformity of the temperature distribution of the shutter 22 (the deposition shield 23) can be improved.

Moreover, by providing the heat exchange accelerating members 226 within the flow paths 221 and 231 having the hollow structure, the strength and the rigidity of the shutter 22 and the deposition shield 23 can be obtained.

Further, as depicted in FIG. 1, the flow paths are formed in both the shutter 22 and the deposition shield 23. However, the exemplary embodiment is not limited thereto, and the flow path may be formed in at least one of the shutter 22 or the deposition field 23.

For example, the flow path 231 may be formed only at the deposition shield 23. The deposition shield 23 has the substantially cylindrical shape and is configured to surround the entire plasma processing space S1. Meanwhile, the shutter 22 is provided at only a part of the cylindrical shape. Therefore, by providing the flow path 231 in the deposition shield 23, the flow path 231 is configured to surround the entire plasma processing space S1.

Further, the flow path 221 may be provided only at the shutter 22. Since the deposition shield 23 is in contact with other members such as the processing vessel 2 and the like, the heat applied from the plasma processing space S1 is radiated to the other members. Meanwhile, since the shutter 22 is the moving member, the contact with other members and the radiation of heat to the other members are less than those of the deposition shield 23. Therefore, the temperature of the shutter 22 may get higher than the temperature of the deposition shield 23. As a resolution, by providing the flow path 221 in the shutter 22, the temperature of the shutter 22, for example, can be adjusted to be same as the temperature of the deposition shield 23. Therefore, the temperature uniformity of the plasma processing space S1 can be improved.

Now, a manufacturing method for the shutter 22 and the deposition shield 23 will be explained. The shutter 22 and the deposition shield 23 have the flow paths 221 and 231 formed therein, respectively, and have the hollow structure.

Therefore, it is desirable to manufacture the shutter 22 and the deposition shield 23 by using a 3D printing technique, an additive manufacturing technique, or the like. Specifically, the additive manufacturing technique using a metal material may be used. By way of example, a manufacturing technique of manufacturing the shutter (deposition shield) by sintering a powder metal by irradiating a laser or an electronic beam to the powder metal, a manufacturing technique of manufacturing the shutter (deposition shield) by, while supplying a powder metal or a wire, dissolving and depositing this material with a laser or an electronic beam, or the like may be employed. These manufacturing techniques are nothing more than examples, and do not limit the exemplary embodiment.

Further, in the shutter 22 (the deposition shield 23), the frame member 224 forming the outline, the partition member 225 forming the flow path 221 and the heat exchange accelerating members 226 disposed in the flow path 221 are all made of the same material. However, the exemplary embodiment is not limited thereto, and different kinds of materials may be used. By way of example, the frame member 224 and the partition member 225 may be made of aluminum, and the heat exchange accelerating members 226 may be made of a metal material (e.g., Cu) having high thermal conductivity. Further, a metal material having high strength may be used for the heat exchange accelerating members 226.

The shutter 22 and the deposition shield 23 described above are disposed between the processing vessel 2 and the stage 5, and have the flow paths through which the heat exchange medium flows. The shutter 22 and the deposition shield 23 are an example of components forming an anode.

The stage 5 is a member forming a cathode. Components forming the anode as an opponent to the components forming the cathode include, besides the shutter 22 and the deposition shield 23, the upper electrode (gas shower head 40) and the baffle plate 20.

[Baffle Plate]

Figures 6A, 6B:
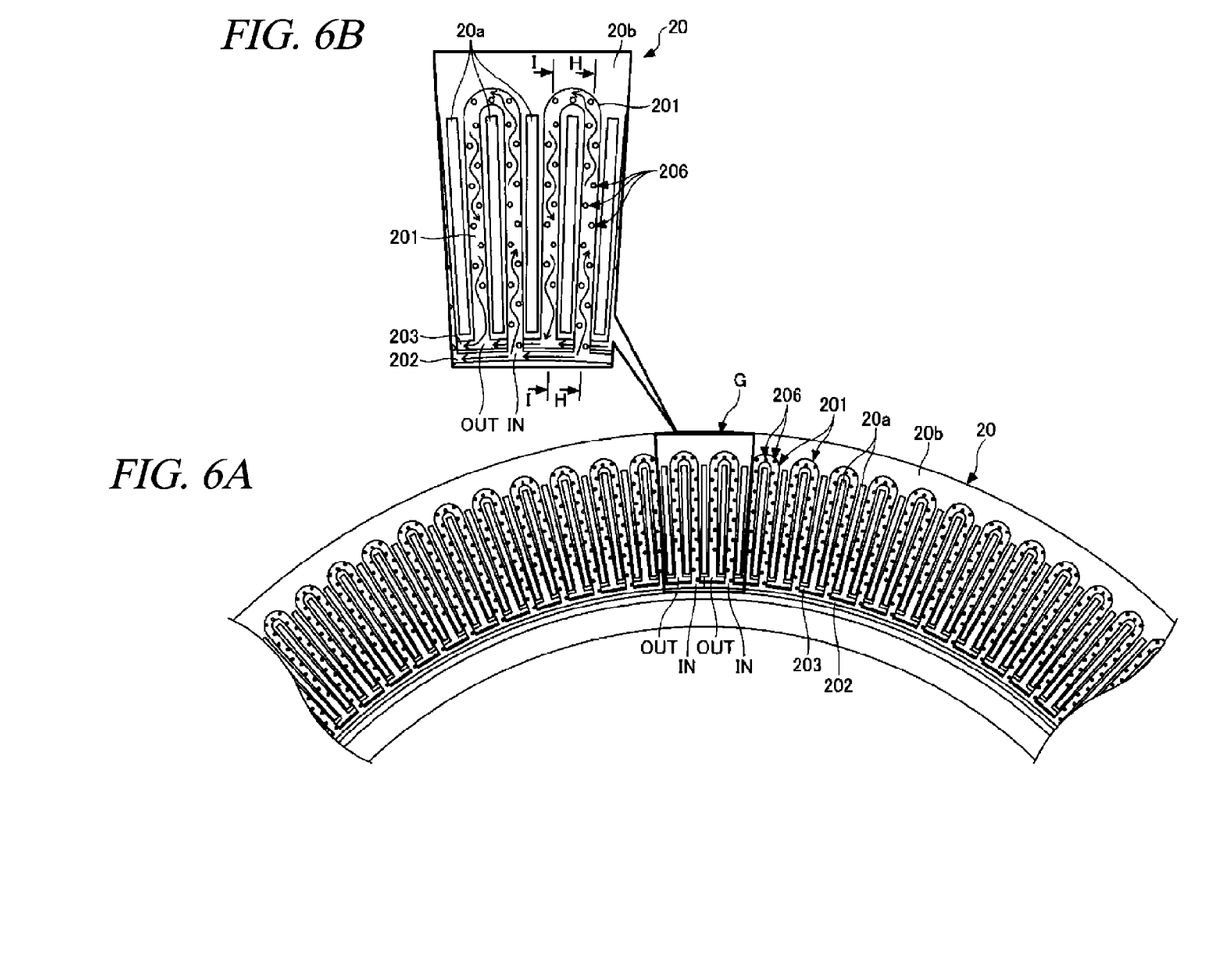
FIG. 6A and FIG. 6B are transversal cross sectional views illustrating a part of an internal structure of a baffle plate of the plasma processing apparatus according to the exemplary embodiment.
Figure 7A:
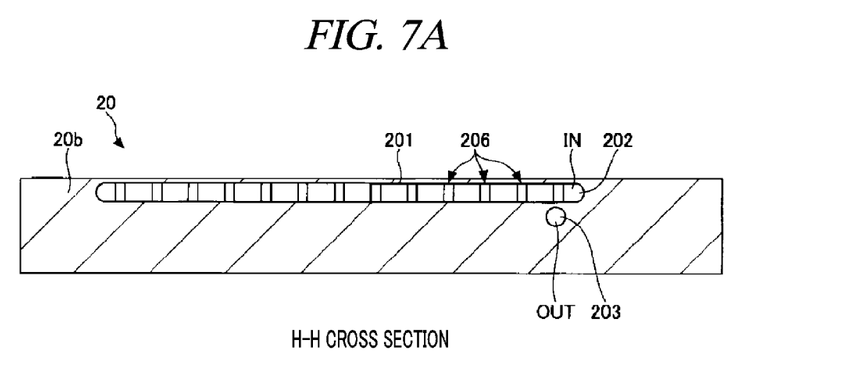
FIG. 7A is a cross sectional view taken along a line H-H of FIG. 6B.
Figure 7B:
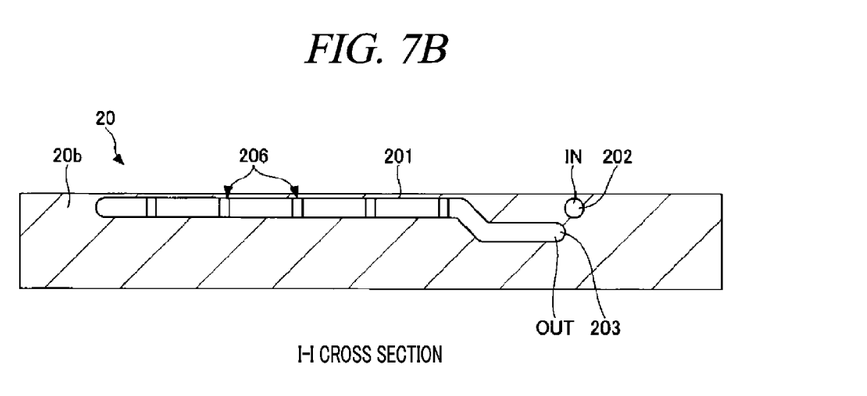
FIG. 7B is a cross sectional view taken along a line I-I of FIG. 6B.

Hereinafter, the baffle plate 20 as another component forming the anode will be explained with reference to FIG. 6A and FIG. 6B and FIG. 7A and FIG. 7B. FIG. 6A and FIG. 6B are transversal cross sectional views illustrating a part of an internal structure of the baffle plate 20 of the plasma processing apparatus according to the exemplary embodiment. FIG. 7A is a cross sectional view taken along a line H-H of FIG. 6B, and FIG. 7B is a cross sectional view taken along a line I-I of FIG. 6B.

The baffle plate 20 has an annular shape. FIG. 6A illustrates a part of the transversal cross section of the baffle plate 20. Further, FIG. 6B illustrates an enlarged view of a region G of FIG. 6A. The baffle plate 20 has a multiple number of slits 20a. These slits 20a are all same and are arranged substantially in parallel to each other. Each of the slits 20a has a length in a width direction of the baffle plate 20, and the slits 20a are disposed to be equi-spaced in a circumferential direction. Each slit 20a is formed through the baffle plate 20.

Flow paths 201 are formed between the respective slits 20a within the baffle plate 20. Each flow path 201 has both ends near an inner end of each slit 20a, and one of these both ends is configured as an inlet IN and the other end is configured as an outlet OUT. Further, the flow path 201 is U-turned at an outside of an outer end of the slit 20a. That is, the flow path 201 is formed in a U-shape along the slit 20a, and the flow paths 201 are arranged in a zigzag shape between the multiple number of slits 20a. Within the baffle plate 20, two flow paths 202 and 203 having a ring shape are formed at inner sides than the slits 20a.

The above-described U-shaped flow path 201 is connected at the inlet IN to the flow path 202, and connected at the outlet OUT to the flow path 203. The coolant outputted from a non-illustrated chiller unit flows through the flow path 202 and is diverged into the multiple flow paths 201 through the inlets IN. The diverged coolants flow through the flow paths 201 formed around the slits 20a to join into the flow path 203 from the outlets OUT, and then, returns back to the chiller unit. Accordingly, the coolant flows in the order of the flow path 202→the flow paths 201→the flow path 203, whereby the temperature of the entire baffle plate 20 can be controlled. As a consequence, the thermal responsiveness is improved.

Further, a direction of the coolant flowing in the flow path 202 and the flow path 203 may not be limited to the direction shown in FIG. 6B. Further, the baffle plate 20 has a hollow structure, and the shapes of the flow paths 201 to 203 formed therein are not limited to the shown example. By way of example, the inlet IN and the outlet OUT may be reversed, and the coolant outputted from the chiller unit may flow in the order of the flow path 203→the flow paths 201→the flow path 202. Each of the flow paths 201 to 203 may be equipped with a flowmeter configured to detect a flow rate of the coolant, a regulator configured to adjust the flow rate of the coolant, and so forth.

Furthermore, the flow path 201 is not limited to being formed to surround the slits 20a of the baffle plate 20. The flow path 201 may be configured to surround two or more neighboring slits 20a among the multiple number of slits 20a, or may be provided at positions which are symmetrical with respect to a center of the baffle plate 20. Further, the flow path 202 and/or the flow path 203 may be provided at an inner position than the inner end of the slit 20a. Furthermore, the flow path may be provided at an outer position than the outer end of the slit 20a, and the above-described flow paths may be combined. However, to improve the temperature controllability and the thermal responsiveness, it is desirable to place the flow paths 201 as densely as possible at a regular distance therebetween.

A multiple number of heat exchange accelerating members 206 are scattered within the flow path 201. The heat exchange accelerating members 206 may be of a rod-shape or a plate shape, or may have other structures (for example, a lattice structure) and be light-weighted. Referring to FIG. 6B, the heat exchange accelerating members 206 are diagonally arranged within the flow path 201 near an outer side surface and an inner side surface of the flow path 201 alternately. However, the arrangement of the heat exchange accelerating members 206 is not limited thereto as long as the heat exchange accelerating members 206 are disposed at positions where they impede the flow of the coolant flowing within the flow path 201. The heat exchange accelerating members 206 increases the contact area with the coolant flowing in the flow path 201, thus accelerating the heat exchange between the baffle plate 20 and the coolant. As a result, the thermal responsiveness can be bettered. Further, the shape and the arrangement of the heat exchange accelerating members 206 are not limited to the shown examples.

A main body 20b of the baffle plate 20 and the heat exchange accelerating members 206 disposed in the flow path 201 may be made of the same material or different materials. By way of example, the main body 20b of the baffle plate 20 may be made of an aluminum, and the heat exchange accelerating members 206 may be made of a metal material (e.g., Cu) having high thermal conductivity. Further, a metal material having high strength may be used for the heat exchange accelerating members 206.

FIG. 7A, which is the cross sectional view taken along the line H-H of FIG. 6B, illustrates the flow path 201 before being U-turned. The flow path 201 before being U-turned is formed along a top surface of the baffle plate 20 directly under the top surface thereof. The flow path 201 is formed at a same level with the flow path 202, and the flow path 201 and the flow path 202 intersect with each other substantially perpendicularly at the position of the inlet IN. The coolant flowing in the flow path 202 is introduced into the flow path 201 from the inlet IN.

FIG. 7B, which is the cross sectional view taken along the line I-I of FIG. 6B, illustrates the flow path 201 after being U-turned. The flow path 201 after being U-turned is formed along the top surface of the baffle plate 20 directly under the top surface thereof, and a leading end of the flow path 201 after being U-turned has a step toward the outlet OUT and is located at the same height as the outlet OUT. Accordingly, the flow path 201 before the step is formed at a height position higher than the flow path 203, and the flow path 201 after the step is formed at a height position level with the flow path 203. The flow path 201 and the flow path 203 intersect with each other substantially perpendicularly at the position of the outlet OUT. Accordingly, the coolant flowing in the flow paths 201 is allowed to meet at the outlet OUT and easily flow into the flow path 203 which is formed at the position lower than the flow path 201 before the step.

The heat exchange accelerating members 206 are densely arranged in the flow path 201 before being U-turned than in the flow path 201 after being U-turned. Accordingly, the contact area with the coolant flowing in the flow path 201 before being U-turned is increased more than the contact area with the coolant flowing in the flow path 201 after being U-turned. Therefore, the heat exchange between the baffle plate 20 and the coolant is accelerated. Here, however, by providing the heat exchange accelerating members 206 in the flow path 201 after being U-turned as well, the heat exchange between the baffle plate 20 and the coolant is further accelerated.

Furthermore, the arrangement of the heat exchange accelerating members 206 is not limited to the above example. By way of example, the heat exchange accelerating members 206 may be arranged at a regular distance within the entire flow path 201. Further, the heat exchange accelerating members 206 may have the same shape or different shapes. Furthermore, the heat exchange accelerating members 206 may be arranged diagonally to each other or in parallel to each other, or arranged in any other manner within the flow path 201.

According to the shutter 22, the deposition shield 23 and the baffle plate 20 of the plasma processing apparatus according to the exemplary embodiment, by allowing the coolant to flow in the flow paths 221, 231 and the flow paths 201 to 203, the temperatures of all the components constituting the anode can be controlled. Accordingly, even if the amount of heat applied to the components constituting the anode, such as the shutter 22, the deposition shield 23 and the baffle plate 20, is increased as the high frequency bias power LF becomes to have a high power, for example, the components constituting the anode can be cooled to have a preset temperature range. Furthermore, it is also possible to control a part of the components constituting the anode, for example, the baffle plate 20, the shutter 22, or the deposition shield 23 to have different temperatures locally.

With regard to a manufacturing method for the baffle plate 20, the baffle plate has the flow paths 201 to 203 formed therein, and has the hollow structure. Therefore, it is desirable to manufacture the baffle plate 20 by using the 3D printing technique, an additive manufacturing technique, or the like. Specifically, the additive manufacturing technique using a metal material may be used. By way of example, a manufacturing technique of manufacturing the baffle plate by sintering a powder metal by irradiating a laser or an electronic beam to the powder metal, a manufacturing technique of manufacturing baffle plate by, while supplying a powder metal or a wire, dissolving and depositing this material with a laser or an electronic beam, or the like may be employed. These manufacturing techniques are nothing more than examples, and do not limit the exemplary embodiment.

So far, the exemplary embodiment of the substrate processing apparatus has been described. However, the present disclosure is not limited to the exemplary embodiment, and various changes and modifications may be made without departing from the scope of the present disclosure.

In the above description, the shutter 22 and the deposition shield 23 are cooled by allowing the coolant to flow in the flow path 221 of the shutter 22 and the flow path 231 of the deposition shield 23. However, the exemplary embodiment is not limited thereto, and the shutter 22 and the deposition shield 23 may be heated by allowing a high-temperature coolant to flow therein. Further, each of the shutter 22 and the deposition shield 23 may be equipped with a heater. With this configuration, the temperatures of the shutter 22 and the deposition shield 23 can be controlled to have the preset temperature range.

Furthermore, the slit 20a is an example of a hole provided in the baffle plate 20. The exemplary embodiment is also applicable to a baffle plate 20 of a hole type other than the slit hole, for example, a circular hole or an elliptical hole.

The plasma processing apparatus according to the exemplary embodiment may be any of an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus. Further, the plasma processing apparatus has been described as an example of the substrate processing apparatus. However, the substrate processing apparatus is not limited to the plasma processing apparatus as long as it performs a preset processing (for example, a film forming processing, an etching processing, or the like) on the substrate. By way of example, the substrate processing apparatus may be a CVD apparatus.

In the present disclosure, the wafer (semiconductor wafer) W has been described as an example of the substrate. Without being limited thereto, however, the substrate may be any of various substrates for use in a LCD (Liquid Crystal Display) and a FPD (Flat Panel Display), or a photomask, a CD substrate, a print substrate, or the like.

According to the exemplary embodiment, it is possible to provide the substrate processing apparatus having the improved thermal responsiveness.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:
1. A substrate processing apparatus, comprising:
a reaction chamber; and
an anode component disposed in the reaction chamber, the anode component having a flow path for a heat exchange fluid,
wherein the reaction chamber has a first opening,
the anode component includes:
a deposition shield having a second opening at a position corresponding to the first opening; and
a shutter configured to open or close the second opening,
wherein each of the deposition shield and the shutter has the flow path,
wherein the anode component includes a frame having an internal space, a partition defining the flow path in the internal space, and a heat exchange accelerating member disposed in the flow path, and
the heat exchange accelerating member has a lattice structure which is configured to support the frame from inside.
2. The substrate processing apparatus of claim 1,
wherein the anode component includes a baffle plate disposed in an exhaust device and the baffle plate has the flow path.
3. The substrate processing apparatus of claim 2,
wherein the heat exchange accelerating member increases a contact area with the heat exchange fluid.
4. The substrate processing apparatus of claim 1,
wherein the heat exchange accelerating member increases a contact area with the heat exchange fluid.
5. The substrate processing apparatus of claim 1,
wherein the frame, the partition and the heat exchange accelerating member are integrated into a single structure.
6. The substrate processing apparatus of claim 1,
wherein the anode component having the flow path is formed by a 3D printing technique or an additive manufacturing technique.
7. The substrate processing apparatus of claim 1,
wherein the deposition shield has a first heat exchange fluid flow path of the flow path and a first hollow structure for the first heat exchange fluid flow path.
8. The substrate processing apparatus of claim 7,
wherein the shutter has a second heat exchange fluid flow path of the flow path and a second hollow structure for the second heat exchange fluid flow path.
9. The substrate processing apparatus of claim 1,
wherein the deposition shield and the shutter are grounded.
10. The substrate processing apparatus of claim 1, further comprising:
a substrate support disposed in an internal space of the reaction chamber; and
an annular baffle plate disposed between the substrate support and the deposition shield, the annular baffle plate having a third heat exchange fluid flow path.
11. The substrate processing apparatus of claim 10,
wherein the annular baffle plate has a metal body and a ceramic coating on the metal body.
12. A plasma processing apparatus, comprising:
a plasma processing chamber having a sidewall and an internal space surrounded by the sidewall, the sidewall having a first opening;
a gate valve configured to open or close the first opening;
a cylindrical shield member detachably disposed along the sidewall in the internal space of the plasma processing chamber, the cylindrical shield member having a second opening facing the first opening, the cylindrical shield member having a first coolant flow path; and
a shutter configured to open or close the second opening, the shutter having a second coolant flow path,
wherein the shutter includes a frame having an internal space, a partition defining the second coolant flow path in the internal space, and a heat exchange accelerating member disposed in the second coolant flow path, and
the heat exchange accelerating member has a lattice structure which is configured to support the frame from inside.
13. The plasma processing apparatus of claim 12,
wherein the cylindrical shield member has a first hollow structure for the first coolant flow path.
14. The plasma processing apparatus of claim 13,
wherein the shutter has a second hollow structure for the second coolant flow path.
15. The plasma processing apparatus of claim 12,
wherein the cylindrical shield member and the shutter are grounded.
16. The plasma processing apparatus of claim 12, further comprising:
a substrate support disposed in the internal space of the plasma processing chamber; and
an annular baffle plate disposed between the substrate support and the cylindrical shield member, the annular baffle plate having a third coolant flow path.
17. The plasma processing apparatus of claim 16,
wherein the annular baffle plate has a metal body and a ceramic coating on the metal body.

* * * * *

UNITED STATES PATENT AND TRADEMARK OFFICE
CERTIFICATE OF CORRECTION

| | |
|---|---|
| PATENT NO. | : 11,532,461 B2 |
| APPLICATION NO. | : 16/659744 |
| DATED | : December 20, 2022 |
| INVENTOR(S) | : Michishige Saito et al. |

It is certified that error appears in the above-identified patent and that said Letters Patent is hereby corrected as shown below:

In the Specification

Column 2, Line 42, "aching" should be -- ashing --.

Signed and Sealed this
Thirty-first Day of October, 2023

Katherine Kelly Vidal
*Director of the United States Patent and Trademark Office*